United States Patent [19]

Gunness

[11] Patent Number: 4,629,029

[45] Date of Patent: Dec. 16, 1986

[54] MULTIPLE DRIVER MANIFOLD

[75] Inventor: David W. Gunness, Niles, Mich.

[73] Assignee: Electro-Voice, Inc., Buchanan, Mich.

[21] Appl. No.: 798,794

[22] Filed: Nov. 15, 1985

[51] Int. Cl.[4] .............................................. H05K 5/00

[52] U.S. Cl. .................................. 181/144; 181/147; 181/152; 181/155; 181/199

[58] Field of Search ............................... 181/144–147, 181/152, 159, 153, 160, 182, 183, 189, 190, 196, 198, 155, 199

[56] References Cited

U.S. PATENT DOCUMENTS

| | | | |
|---|---|---|---|
| 1,760,377 | 5/1930 | Shaw | 181/159 |
| 4,143,738 | 3/1979 | Nakazono et al. | 181/159 |
| 4,437,540 | 3/1984 | Murakami et al. | 181/152 X |
| 4,524,846 | 6/1985 | Whitby | 181/159 X |

FOREIGN PATENT DOCUMENTS

| | | | |
|---|---|---|---|
| 2309005 | 12/1976 | France | 181/153 |

*Primary Examiner*—Benjamin R. Fuller
*Attorney, Agent, or Firm*—Darby & Darby

[57] ABSTRACT

A multiple driver manifold for coupling four high frequency drivers to a single horn. Two drivers are mounted in a "Y" or "skewed" configuration, and two additional drivers are mounted so as to be directly opposed to one another along a line perpendicular to both the horn throat on-axis direction and the general plane of the "Y" configuration. Sound radiated transverse to the horn on-axis direction by the opposed drivers is "ray-reflected" by a unique ray-reflection summation plug located at the internal hub of the four acoustic paths.

20 Claims, 5 Drawing Figures

FIG. 3
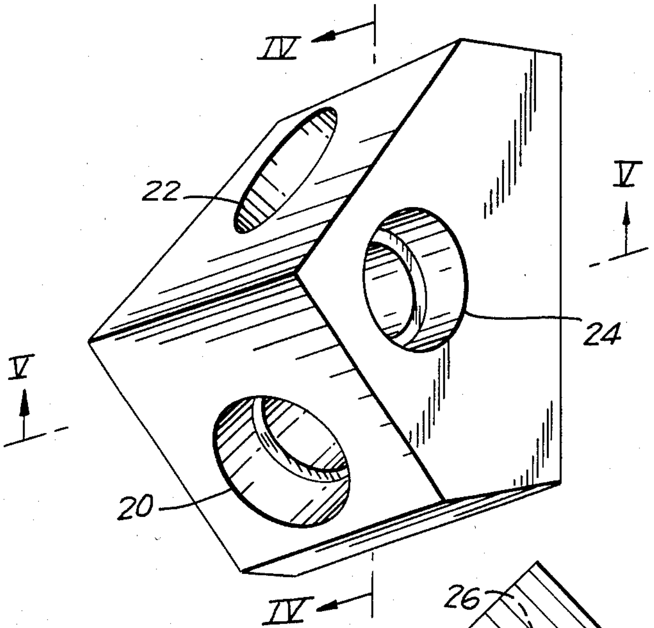
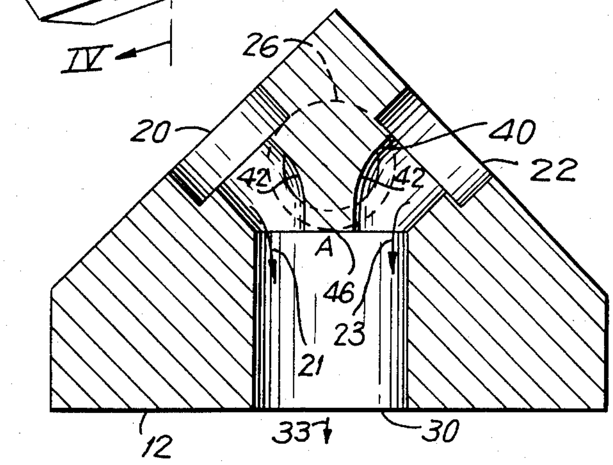
FIG. 4
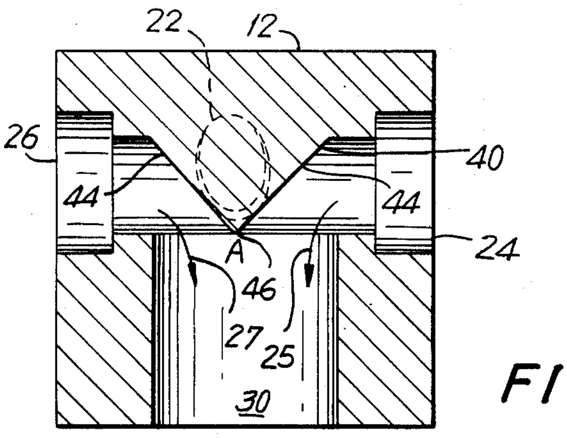
FIG. 5

MULTIPLE DRIVER MANIFOLD

BACKGROUND OF THE INVENTION a. Field of the Invention

This invention relates to an arrangement of acoustic drivers for use in a loudspeaker system. More particularly, the invention is directed to a manifold for coupling multiple acoustic drivers to a single sound-radiating horn.

b. Description of the Prior Art

Acoustic drivers are often used in conjunction with sound-radiating horns in sound applications requiring high acoustic power output (sound volume), such as in theaters, arenas, or for studio and stage monitoring, discotheques and the like. In many sound systems, separate components such as driver/horn assemblies or conventional cone/enclosure loudspeakers are used for sound reproduction across the entire range of audible sound, with different devices covering the bass, midrange and high frequency portions of the audible spectrum.

A particular sound application may require an especially high power output across the spectrum. With respect to the high frequency range, this has been accomplished in the past in at least two different ways. First, it may be possible simply to increase the number of high frequency driver/horn assemblies. This solution results in destructive interference and requires too much space for many applications. Another solution has been to gang two high frequency drivers to the same sound-radiating horn. A number of difficulties arise when attempting to sum acoustic wavefronts from multiple drivers for radiation through a single horn, including standing wave interference and phase cancellation between the ganged drivers. Additionally, the geometry for providing a constantly expanding cross-section for the acoustic path of each driver presents severe limitations on the design of a multiple driver configuration. As a result, this option has been used with some success only in the clustering of two high frequency drivers.

There are several known structures for combining the outputs of multiple drivers. Most of these devices "bend" the output of each of the drivers at an angle less than ninety, and typically, thirty degrees from the driver on-axis direction to the horn on-axis direction in order to direct the sound into the throat of a single horn.

One such device is illustrated in FIG. 1, and is known as a "Y" manifold, this designation being due to its general resemblance to the letter Y. This manifold 100 comprises a main body section 102, in the form a tube, joined to two arm sections 104,106, also tubular in form. The body section 102 is provided with means 103 for attaching the manifold 100 to the throat port of a sound-radiating horn, the mounting means here being illustrated as a flange. Each of the arm sections 104,106 is similarly provided with means 105,107, respectively, for connecting acoustic drivers to the arm sections so that sound from each driver may be directed into an arm section for summation in the body section 102 and subsequent radiation out through the single horn (not shown) coupled to flange 103.

While the "Y" device is somewhat effective for combining the outputs of two high frequency drivers, the general concept is not successfully applied to high frequency systems where more than two drivers are required.

A "double-Y" manifold 200 for combining the output of four acoustic drivers (not shown) is illustrated in FIG. 2, labelled as prior art. This manifold is of similar design and construction to the "Y" manifold 100 of FIG. 1. The "double-Y" manifold has several limitations, the most significant being its useful frequency range. The manifold response in the high frequency range is disturbed by various internal acoustic interference mechanisms to such a degree that use of the "double-Y" manifold is effectively precluded in that range. In this device, each of the drivers is mounted at approximately the same offset angle from the horn on-axis direction, compounding the effect of a wavelength-dependent interference mechanism known as comb filtering. When a driver on-axis direction differs from the the horn throat on-axis direction, the horn response exhibits drop-outs at spaced intervals along the frequency spectrum, with the location of these response drop-outs being related to the angle at which the driver is offset from the horn on-axis direction. A "double-Y" manifold thus cannot be operated in the high frequency range due to the concurrence of drop-outs from each of the four drivers at the same points along the frequency spectrum.

Furthermore, the cluster of drivers mounted to a "double-Y" manifold is bulky and occupies a large space behind the sound-radiating horn.

SUMMARY OF THE INVENTION

An object of the invention is to provide an improved maximum output speaker system for high-volume sound. A more specific object is to provide an efficient device for summing the outputs of a number of individual high frequency acoustic drivers for radiation from a single sound-radiating horn.

Another object of the invention is to provide a multiple driver arrangement for use with sound-radiating horns having an industry standard two-inch throat. A specific object is to provide such a device for high-frequency applications.

Another object is to provide a multiple driver arrangement occupying the smallest possible volume for the number of acoustic drivers used.

According to an embodiment of the invention, a multiple driver manifold is provided for coupling four high frequency drivers to a single horn. The drivers are arranged on the manifold so as to occupy substantially the smallest possible envelope, the configuration being termed "skewed/opposed close packing". In this arrangement, two drivers are mounted in a "Y" or "skewed" configuration, each offset from the horn throat on-axis direction approximately 45 degrees, and two additional drivers are mounted so as to be directly opposed to one another along a line perpendicular to both the horn throat on-axis direction and the general plane of the "Y" configuration. Within the manifold, the acoustic paths from entry ports of the "skewed" drivers bend approximately 45 degrees from the entry ports to the manifold exit port at the horn throat coupling. The acoustic paths for the opposed drivers, however, include a turn of approximately 90 degrees. Sound radiated transverse to the horn on-axis direction by the opposed drivers is "ray-reflected" around the 90 degree turn by a unique ray-reflection summation plug located at the hub of the four acoustic paths corresponding to the four drivers.

BRIEF DESCRIPTION OF THE DRAWINGS

Other objects, features and advantages of the invention mentioned in the above brief explanation will be more clearly understood when taken together with the detailed description below and the accompanying drawings, in which:

FIG. 3 is perspective view of a multiple driver manifold according to aspects of the invention;

FIG. 4 is a cross-sectional view of the manifold of FIG. 3, along line IV—IV, showing the acoustic paths for the skewed pair of drivers; and FIG. 5 is another cross-sectional view of the manifold of FIG. 3, along line V—V, showing the acoustic paths for the opposed pair of drivers.

DETAILED DESCRIPTION OF THE PREFERRED EMBODIMENTS

Referring generally to FIGS. 3-5, a preferred embodiment of a multiple driver manifold 10 is shown. The manifold 10 comprises a housing 12 onto which individual acoustic drivers (not shown) may be mounted, the manifold 10 in turn being coupled to the throat of a sound-radiating horn. In the embodiment illustrated, the housing 12 is a shaped block of any suitably strong material, such as aluminum, epoxy resin compound, high strength plastic, or the like. Housing strength is necessary not only to support the weight of the drivers but also to withstand the mutual repulsion of magnets which are integral parts of the drivers, and also to withstand the extreme vibration conditions under which the manifold is intended to operate.

The particular external shape of the block has no special significance, the invention instead being related to the orientation and special shape of the internal acoustic paths. This special orientation, however, includes the particular directions at which the various drivers are to be secured to the housing at their respective manifold entry ports 20,22,24,26 with respect to each other and the manifold exit port 30.

Figure 1:
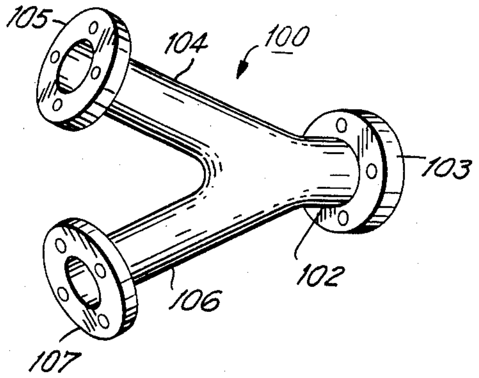
FIG. 1 PRIOR ART
FIG. 1 is a perspective view of a prior art "Y" manifold attached to a typical sound-radiating horn.
Figure 2:
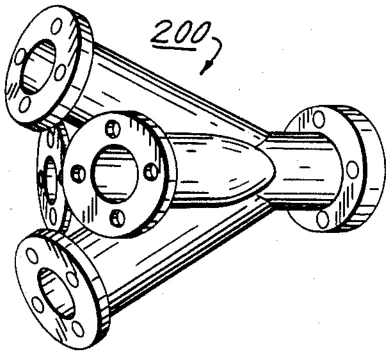
FIG. 2 PRIOR ART
FIG. 2 is a perspective view of a prior art "double-Y" manifold.

Thus, the housing 12 need not be formed from a block of material, generally, as in FIGS. 3-5, but may also be constructed from specially oriented and joined tube sections, similar to the prior art devices shown in FIGS. 1 and 2, or may be molded in one or more parts with or without subsequent machining.

Referring to FIG. 3, the manifold housing 12 is provided with a plurality of entry ports 20,22,24,26, only three of which are visible in this perspective view. The entry ports may be adapted to receive any particular mounting means associated with particular acoustic drivers. For example, the housing 12 in the vicinity of each entry port could be drilled and tapped, for bolting a driver directly onto the housing. Instead, the manifold entry ports could be threaded to receive drivers having threaded ports. This invention is not limited to any particular means for mounting the individual drivers to the manifold housing.

Although the present embodiment is described as having four entry ports, the invention is not so limited. Principles of the invention may be applied to extremely compact configurations of two, three, and virtually any other number of drivers, the particular number only determined by the specific application, as further explained below.

Referring to FIG. 4, the special internal orientations of acoustic paths according to aspects of the invention are more clearly shown. A manifold exit port 30 is provided for radiating sound in an outward direction 33 corresponding to the horn throat on-axis direction, the radiated sound comprising the summed wavefronts from all of the drivers mounted to the manifold 10. The exit port 30 may be sized to mate with any particular horn, or may be sized and configured to a particular standard throat size, such as two inches.

One pair of entry ports 20,22 are "skewed" or positioned at predetermined angles with respect to the on-axis direction 33 of the exit port 30. In this preferred illustrative embodiment, the on-axis directions of the skewed entry ports 20,22 (actually of the drivers mounted at these ports) are angularly displaced approximately 45 degrees from the exit port on-axis direction 33, and are angularly displaced from each other approximately 90 degrees, for reasons which will be more clearly described below. The on-axis directions of these entry ports 20,22 and the manifold exit port 30 are substantially coplanar.

Internal spaces of the manifold housing 12 define acoustic paths 21,23 between the entry ports 20,22 and the exit port 30, respectively. Acoustic wavefronts produced by drivers connected to the skewed entry ports 20,22 are summed inside the housing 12 in the general region marked "A". The paths 21,23 bend by the same offset angle, approximately 45 degrees in this preferred embodiment, along the routes from the entry ports 20,22 into the summing region A and out through the exit port 30.

Referring now to FIG. 5, two additional entry ports 24,26 are shown, making a total of four, with these entry ports being substantially opposed along a line substantially perpendicular to the plane of the skewed ports 20,22 according to the invention. Thus, drivers mounted at the opposed ports 24,26 are also substantially perpendicular to the on-axis direction 33 of the manifold exit port 30. The acoustic paths 25,27 from these ports to the exit manifold 30 include substantially right angle turns.

An acoustic manifold according to the invention may have only opposed drivers, i.e., two drivers opposed and mounted transversely of the on-axis sound radiation direction of the coupled horn.

The relationship of the skewed and opposed pairs of entry ports is as follows. As discussed above, a wavelength-dependent phenomenon known as comb-filtering occurs when a source (the driver exit) radiates sound at a direction which is angularly offset from the horn throat on-axis direction. Drop-outs in response occur at spaced intervals along the frequency spectrum, the location of the pattern of drop-outs being related to the offset angle. At 90 degrees off-axis, corresponding to the opposed entry ports 24,26, the drop-outs occur at frequencies whose wavelengths correspond to the size of the source and sub-multiples of its size. At or near the on-axis direction, the drop-outs are above the useful frequency range for audible sound systems.

It has been found that the spaced intervals between drop-outs change only gradually as the offset angle varies, with the entire "comb" pattern shifting upwardly along the frequency spectrum as the offset angle decreases toward on-axis. At approximately 45 degrees off-axis, corresponding to the skewed entry ports 20,22, at least the first two drop-outs occur at frequencies exhibiting response peaks in the 90 degrees off-axis configuration. Thus, it has been discovered that the summed response of a source at 90 degrees off-axis and a source at 45 degrees off-axis is generally smoother than the response of either alone, the peaks of one tending to cancel the drop-outs of the other.

A practical advantage of the skewed/opposed driver arrangement on the manifold 10 is that the cluster is extremely compact. The manifold size may be adjusted so that each of the opposed drivers actually or almost contacts each of the skewed drivers, at the magnet or casing edges of each, and also so that each of the skewed drivers contacts the other skewed driver as well as both opposed drivers. This arrangement is virtually the minimum spacing possible for a cluster of four drivers.

Devices not having the skewed pair of drivers would not take advantage of the interaction between the two different pairs Improved summing performance may nonetheless be obtained.

Still another important aspect of the invention is shown in FIGS. 4 and 5. While a simple bore extending from one opposed driver to the other may provide satisfactory results in some circumstances, significantly improved wavefront summation is obtained by specially shaping a portion of the interior surface of the housing. In this illustrative embodiment, the rear surface 40 of the manifold interior area A is shaped to form a "ray reflection summation plug" for improving summation of wavefronts from each of the acoustic paths 21,23,25,27.

Referring first to FIG. 4, the manifold interior rear surface 40 includes curved portions 42 sloping progressively nearer the exit port on-axis direction 33 for directing sound produced at the skewed entry ports 20,22 closer to that on-axis direction 33.

In FIG. 5, the rear surface 40 is seen to have a generally pyramidal shape, with substantially flat surfaces 44 angled to reflect, rather than guide, wavefronts originating from the opposed entry ports 24,26 toward the manifold exit port 30. Each of the flat surfaces 44 of the plug is oriented at an angle in the range 40–50 degrees with respect to both the respective entry port and the manifold exit port on-axis direction 33. The center plug is generally of a height equal to or greater than the diameter of the entry holes, as shown. In a preferred construction, the normal to the reflecting surface approximately bisects the 90 degree angle between each of the opposed entry ports 24,26 and the exit port 30. While useful over the entire audible spectrum, this is particularly important for proper summation of high frequency sound. The elongate apex 46 of this embodiment of a ray reflection summation plug is shown in FIGS. 4 and 5. With the manifold interior surface 40 so designed, summation of the multiple wavefronts occurs as soon as possible after leaving the driver exits.

When a model of the above-described embodiment of the invention was tested, unusual and unexpected performance characteristics were discovered. In particular, the manifold frequency response in the portion of the high frequency range above 8 kHz was found to be smoother than the individual on-axis frequency response of any of the four particular drivers mounted to the manifold, testing each of the drivers separately. This provides the ability to obtain improved performance from existing drivers without any modification to the drivers themselves.

The measured response of this embodiment of the invention yielded exceptional summed response with no significant loss (acoustic power) from nearly zero hertz to 20 kHz, corresponding to virtually the entire useful acoustic frequency range.

In addition, very little degradation in system performance resulted even where at least one of the drivers was found to have severe response irregularities above 8 kHz. In other words, the summed response tended to minimize problems or defects in any of the several drivers. This provides the advantage of redundancy, an important feature in high power sound systems used in performance settings.

While one embodiment of the invention has been described in detail, it will be understood that many variations and modifications, in addition to those already mentioned, are possible without departing from the spirit or scope of the invention. In particular, the manifolding concept may be used as a building block for larger and larger combinations of drivers. The number of possible variations is infinite, limited only by practical size and performance constraints. For example, an eight-driver device may be created by manifolding the outputs of two four-driver manifolds through a two-driver manifold, after making appropriate scaling modifications. A sixteen-driver device may be created by manifolding four four-driver manifolds to another size-coordinated four-driver manifold, and so on. Scaling corrections would include modifications to the input and output hole sizes, as well as any changes needed to overcome increasingly difficult summation problems.

What is claimed is:

1. A manifold for combining the outputs of a plurality of acoustic drivers, comprising:
   - a manifold housing having a plurality of entry ports for receiving sound from said drivers, and also having onlu one exit port for radiating sound generally axially through said only exit port, said housing having internal paths for directing sound from each of said entry ports to said exit port, a first pair of said entry ports having their respective axial sound-radiating directions substantially aimed at one another along a line generally perpendicular to the axial sound-radiating direction of the single exit port, the paths for the first pair of entry ports being partially defined by a sound reflecting plug within the housing interior.

2. The manifold according to claim 1, also having another pair of entry ports, each having an axial sound-radiating direction angularly displaced a predetermined angle with respect to the axial direction of the exit port.

3. The manifold according to claim 2, wherein the predetermined angle is within the range 40 to 50 degrees.

4. The manifold according to claim 2, wherein the predetermined angle is approximately 45 degrees.

5. The manifold according to claim 1, wherein the sound reflecting plug has substantially flat surfaces, the flat surfaces being angularly displaced a predetermined angle from the axial direction of the opposed pair of entry ports.

6. The manifold according to claim 5, wherein the predetermined angle is within the range 40 to 50 degrees.

7. The manifold according to claim 5, wherein the other predetermined angle is approximately 45 degrees.

8. A manifold for combining the outputs of a plurality of acoustic drivers each having an axial sound-radiating direction, comprising:
- a manifold housing having a plurality of entry ports and a single exit port, the housing having internal paths for conducting sound from each of the entry ports to the exit port, said paths being defined at least in part by surfaces of a sound reflecting plug within the housing interior; and
- means for mounting the plurality of drivers at the plurality of entry ports on the housing, the mounting means being adapted so that at least one pair of the drivers have their respective sound-radiating directions aimed substantially directly at each other when attached to the mounting means.

9. A manifold for combining the outputs of a plurality of acoustic drivers, comprising:
- a manifold housing having a plurality of entry ports and a single exit port, the housing having internal paths for conducting sound from each of the entry ports to the exit port, at least two of the internal paths including substantially right angle bends, said paths being at least partially defined by a sound reflecting plug within the housing interior.

10. A manifold according to any of claims 1, 2, 8, or 9, further comprising:
- a plurality of acoustic drivers, the drivers being coupled to the manifold at the entry ports.

11. A manifold according to claim 10, further comprising:
- a sound-radiating horn coupled to the manifold exit port.

12. A method for combining the acoustic outputs of a plurality of acoustic drivers for radiation through a single sound-radiating horn, comprising the steps:
- coupling a first pair of drivers to a manifold, said manifold including a housing having a plurality of entry ports for receiving sound from said drivers and also a single exit port for radiating sound generally axially through said exit port into said horn, said housing having internal paths for directing sound from each of said entry ports to said exit port, said paths being at least partially defined by a sound reflecting plug within the housing interior, a first pair of said entry ports having axial sound-radiating directions aimed substantially at each other along a line generally perpendicular to the axial sound-radiating direction of the exit port, the housing also having another pair of entry ports, each angularly displaced a predetermined angle with respect to the axial direction of the exit port, said first pair of drivers being coupled to said first pair of entry ports;
- coupling a second pair of drivers to said other pair of entry ports; and
- coupling a horn to said manifold exit port.

13. A method for smoothing the frequency response curve of a sound-radiating horn, comprising the steps:
- acoustically and mechanically coupling each of a first pair of said drivers to said horn, through manifold means for acoustically adding outputs of said first pair of drivers, at predetermined angularly displaced directions with respect to an on-axis direction of the horn; and
- acoustically and mechanically coupling each of a second pair of said drivers to said horn, through said manifold means, at substantially right angles to the horn on-axis direction, the second pair of drivers having sound-radiating directions aimed substantially at each other.

14. The method according to claim 13, wherein the predetermined angular displacements are approximately 45 degrees, whereby predetermined peaks in the horn frequency response curve due to the first pair of drivers generally correspond in acoustic frequency to predetermined drop-outs in the horn response curve due to the second pair of drivers, and predetermined peaks in the horn frequency response curve due to the second pair of drivers generally correspond to predetermined drop-outs in the horn response curve due to the first pair of drivers.

15. A manifold for combining the outputs of two acoustic drivers, comprising:
- a manifold housing having two entry ports for receiving sound from said drivers, and also having a single exit port for radiating sound generally axially through said exit port, said housing having internal paths for directing sound from each of said entry ports to said exit port, said paths for the pair of entry ports being partially defined by a sound reflecting plug within the housing interior, said pair of entry ports having axial sound-radiating directions aimed substantially at each other along a line generally perpendicular to the axial direction of the exit port.

16. The manifold according to claim 15, wherein the sound reflecting plug has substantially flat surfaces, the flat surfaces being angularly displaced another predetermined angle from the axial direction of the opposed pair of entry ports.

17. The manifold according to claim 16, wherein the other predetermined angle is within the range 40 to 50 degrees.

18. The manifold according to claim 16, wherein the other predetermined angle is approximately 45 degrees.

19. A manifold according to claim 15, further comprising:
- two acoustic drivers, the drivers being coupled to the manifold at the entry ports.

20. A manifold according to claim 19, further comprising:
- a sound-radiating horn coupled to the manifold exit port.

* * * * *